US012184027B2

(12) United States Patent
Van Wynsberghe

(10) Patent No.: US 12,184,027 B2
(45) Date of Patent: Dec. 31, 2024

(54) RE-PUMPED ROOM-TEMPERATURE MASER

(71) Applicant: Erinn Van Wynsberghe, London (CA)

(72) Inventor: Erinn Van Wynsberghe, London (CA)

( * ) Notice: Subject to any disclaimer, the term of this patent is extended or adjusted under 35 U.S.C. 154(b) by 3 days.

(21) Appl. No.: 18/005,517

(22) PCT Filed: Jul. 13, 2021

(86) PCT No.: PCT/CA2021/050964
§ 371 (c)(1),
(2) Date: Jan. 13, 2023

(87) PCT Pub. No.: WO2022/011464
PCT Pub. Date: Jan. 20, 2022

(65) Prior Publication Data
US 2023/0275384 A1    Aug. 31, 2023

Related U.S. Application Data

(60) Provisional application No. 63/150,282, filed on Feb. 17, 2021, provisional application No. 63/051,003, filed on Jul. 13, 2020.

(51) Int. Cl.
*H01S 1/02*    (2006.01)
*G04F 5/14*    (2006.01)
*H03L 7/26*    (2006.01)

(52) U.S. Cl.
CPC .............. *H01S 1/02* (2013.01); *G04F 5/14* (2013.01); *H03L 7/26* (2013.01)

(58) Field of Classification Search
CPC .............. H03L 7/26; G04F 5/14; H01S 1/02
(Continued)

(56) References Cited

U.S. PATENT DOCUMENTS

2015/0214687 A1    7/2015  Oxborrow
2017/0077665 A1 *  3/2017  Liu ..................... H01S 1/005

FOREIGN PATENT DOCUMENTS

WO    WO-2017114703 A1 *  7/2017  ............. G01R 33/60

OTHER PUBLICATIONS

International Preliminary Report on Patentability dated Jan. 26, 2023 for PCT/CA2021/050964 Filed Jul. 13, 2021.

* cited by examiner

*Primary Examiner* — Arnold M Kinkead

(57) ABSTRACT

The present invention relates to (1) a MASER (microwave or molecular amplification by stimulated emission of radiation) that can operate effectively in environments as warm as (but not limited to) typical room temperature and pressure, comprised of (i) pump to provide energy through electricity or electromagnetic waves, (ii) a resonator cavity, (iii) an output coupler, (iv) supporting structural material, and (v) a gain medium of guest and host molecules selected and configured so as to allow for emission in desired frequencies such as those widely recognized for wireless communication (between 3 MHz and 300 GHz) and those desired for wireless power transmission (including but not limited to 2.45 GHz and 5.8 GHz); along with (3) a method for absorbing energy such as (but not limited to) harnessing ambient light (including but not limited to solar radiation) and storing such light for purposes of generating a sufficient charge to provide a pump source for the MASER; (4) a method for adjusting the value of the energy gap between the lowest and highest triplet sublevels of the gain medium at will so as to allow for rapid frequency tuning as desired; (5) a method of re-pumping excitons from the lower triplet sublevel to a higher energy level; along with (6) a method of collimating and focusing energy output as parallel electromagnetic waves; plus (7) a method for steering waves in (Continued)

desired directions; and (8) a method for enabling two or more devices to exchange information including but not limited to geographic coordinates, angle of orientation, velocity, acceleration, yaw, pitch, and roll, in order to directly and efficiently exchange electromagnetic waves.

16 Claims, 6 Drawing Sheets

(58) Field of Classification Search
USPC .................. 331/3, 94.1, 155; 333/226; 330/4
See application file for complete search history.

Figure 1. Components of MASER system with sample dimensions (not to scale)
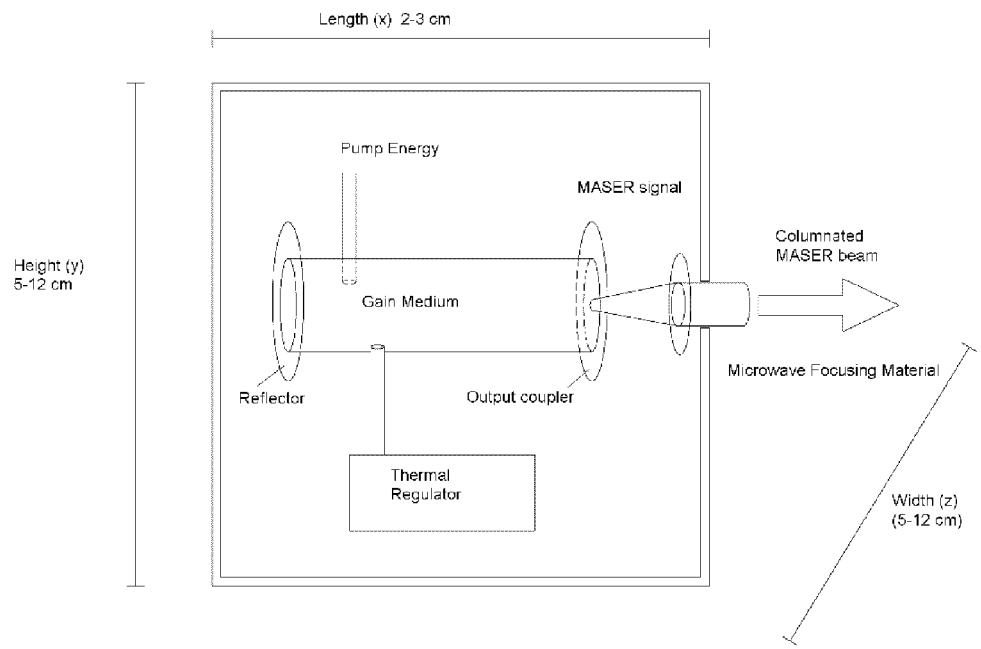
Figure 2. Components of MASER system
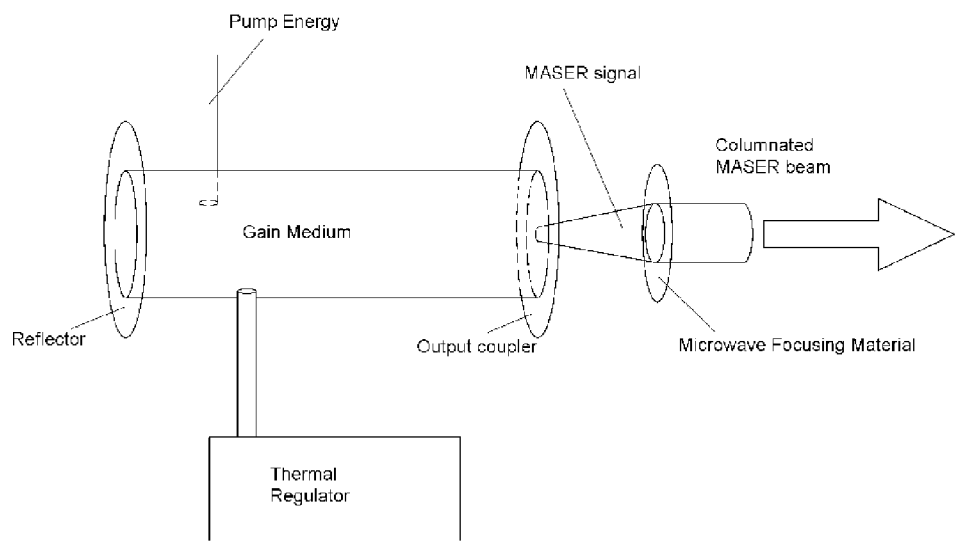

Figure 3. Components of MASER system (in color)
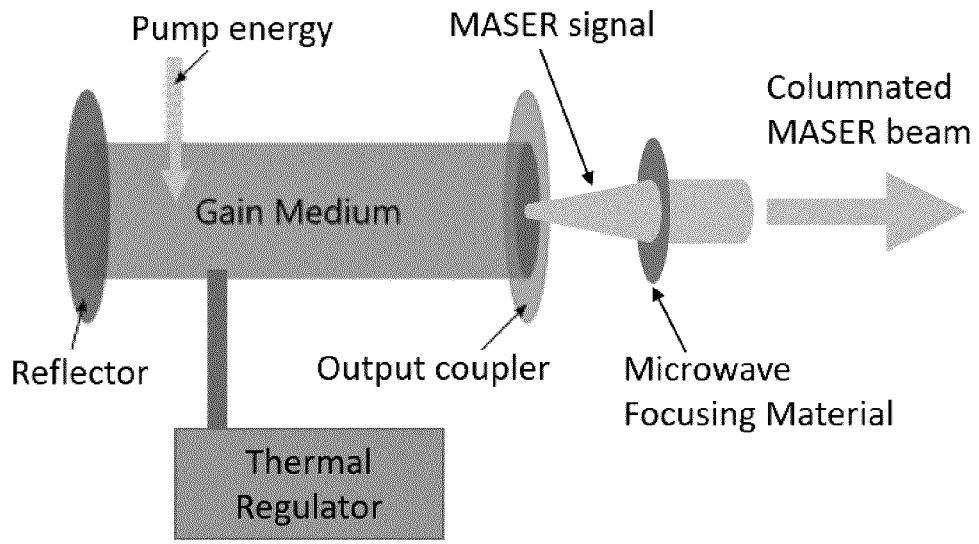
Figure 4. Room-temperature MASER apparatus
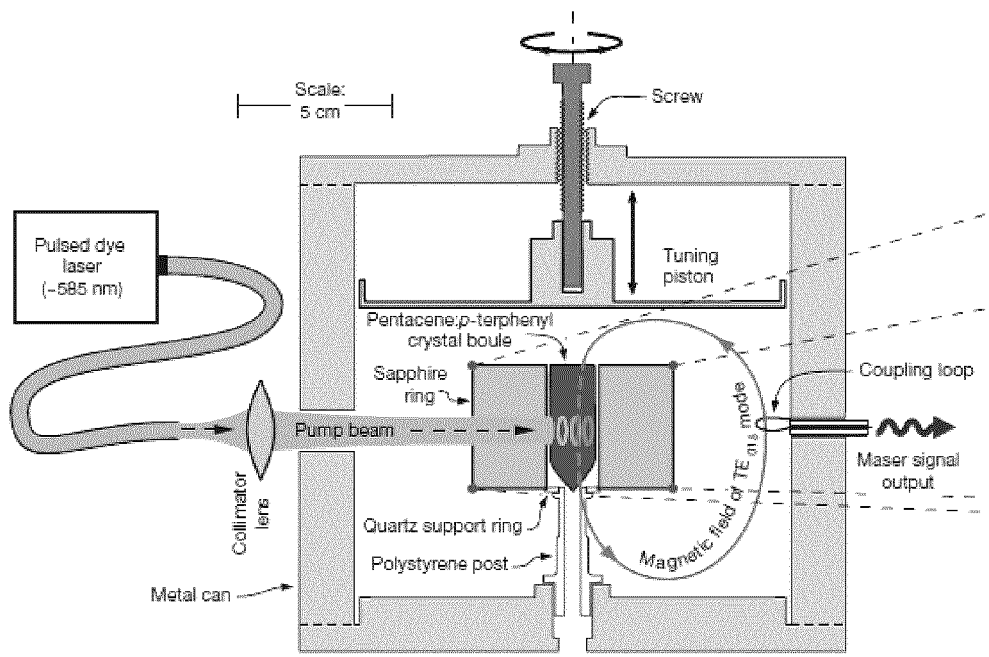

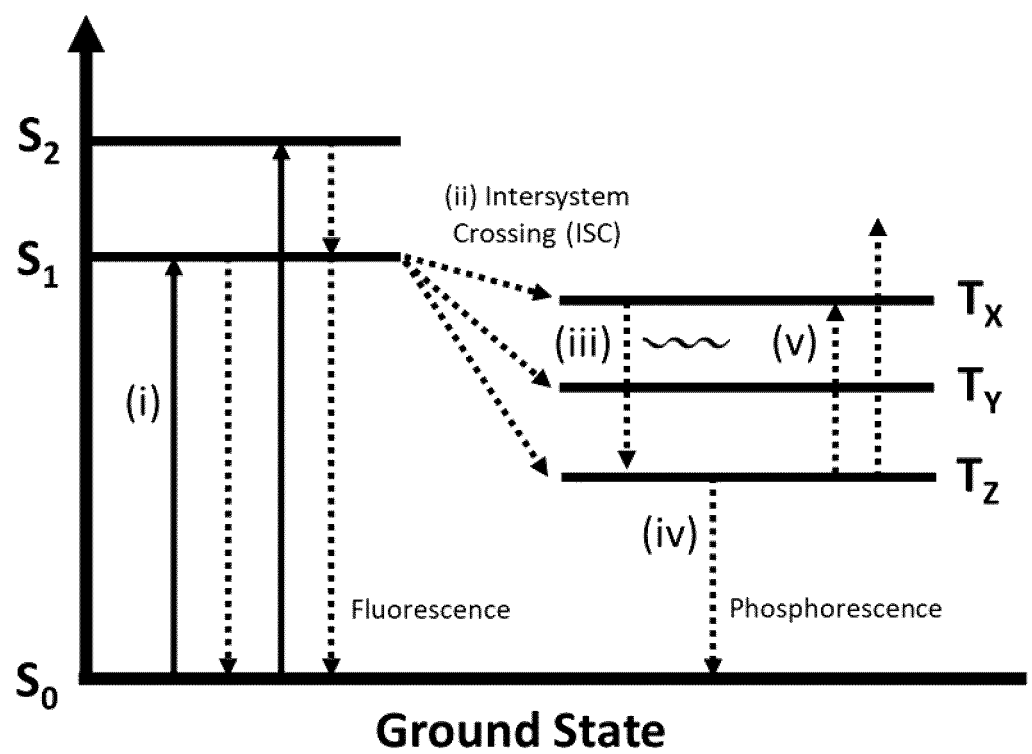
Figure 5. MASER Energy Diagram

Figure 6. Frequency Tuning
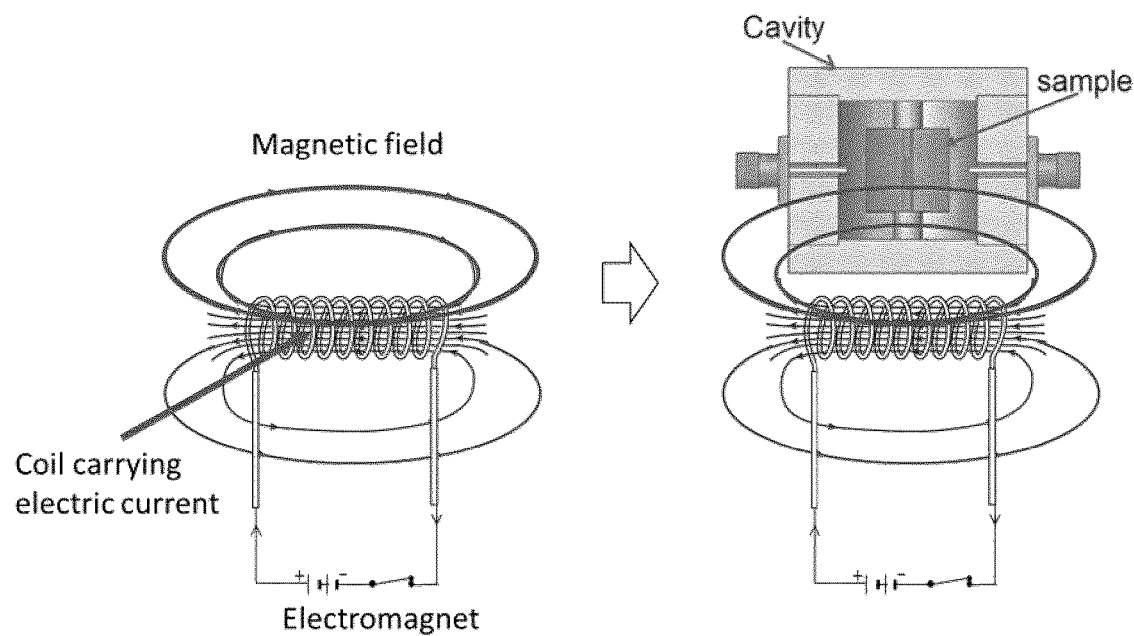
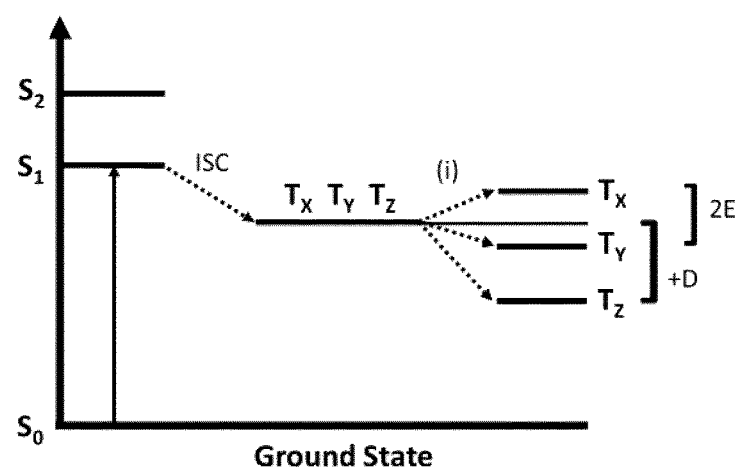

Figure 7. Exciton Re-Pumping
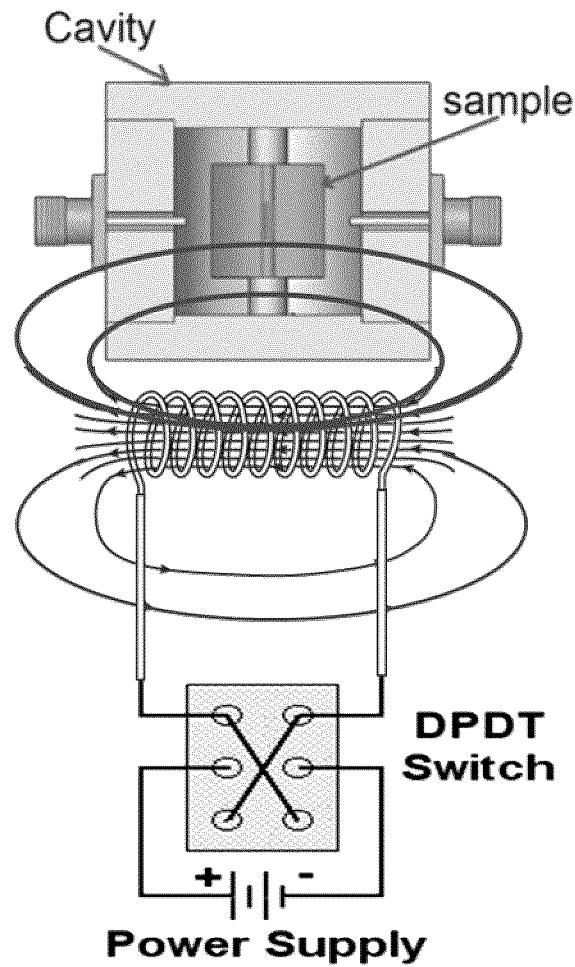
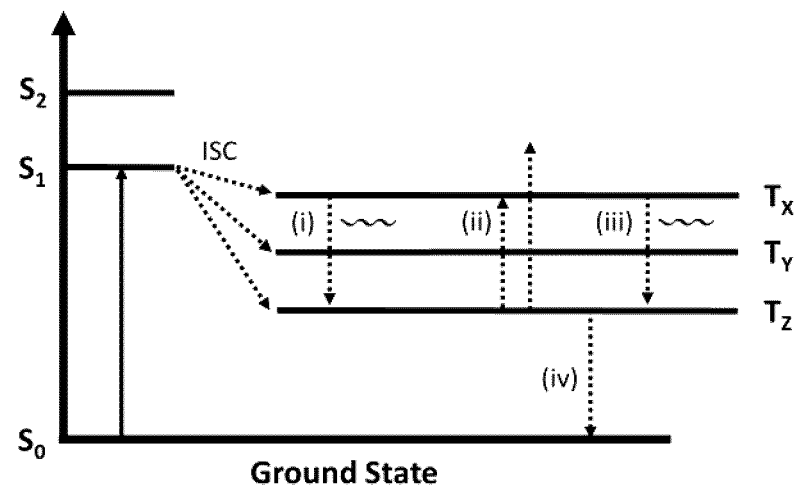

Figure 8. Multi-Unit Arrangement
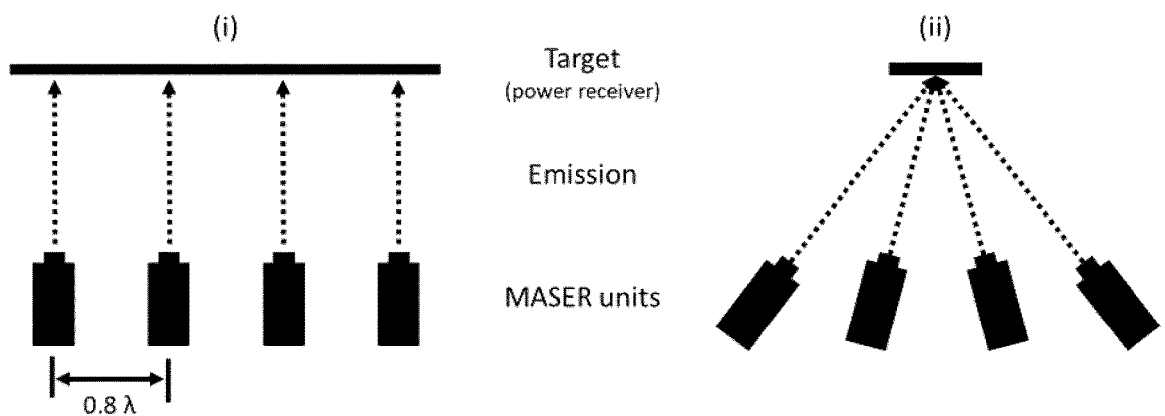

RE-PUMPED ROOM-TEMPERATURE MASER

CROSS-REFERENCE TO RELATED APPLICATIONS

This application claims priority to U.S. provisional patent application Ser. No. 63/051,003 filed Jul. 13, 2021 and U.S. Provisional Patent Application Ser. No. 63/150,282 filed Feb. 17, 2021.

DESCRIPTION

Technical Fields of Invention

The present invention relates to the following technical fields:
Coherent radiative emission
Stimulated emission
Solid state devices
Microwave devices
Microwave cavity resonators
Microwave wave guides and circuitry
Organic semiconductor devices
Spin transport electronics (or "spintronics")
Electron/exciton energy levels
Intersystem crossing
Triplet sub-level spin manipulation
Fluorescence and phosphorescence
Magnetic fields
Polarity manipulation
Thermal management
Electron paramagnetic resonance/electron spin resonance
Metamaterials and Metasurfaces and Plasmonic and active optical waveguides
Molecular (or microwave) amplification by stimulated emission of radiation (MASER)

BACKGROUND INFORMATION

The MASER (microwave or molecular amplification by stimulated emission of radiation) is a device which produces coherent electromagnetic signals in the microwave, radio, and infrared spectra by generating and amplifying stimulated emission of excited electrons.

The first MASER was built in 1953 by Charles H. Townes, James P. Gordon, and Herbert J. Zeiger at Columbia University. Their invention is recognized through U.S. Pat. No. 2,929,922A (Schawlow and Townes, 1958). The 1964 Nobel Prize in Physics was awarded to Nikolay Basov and Alexander Prokhorov for theoretical work leading to the maser. The concept of stimulated emission was first proposed by Albert Einstein (1917). A narrow stream of emitted photons was achieved by priming with an apparatus such as an electron gun.

Applications for the MASER have included the timekeeping component in atomic clocks, and low-noise amplifiers found in radio telescopes and in the ground station for deep-space spacecraft communication.

The original MASER was limited in functionality by low output efficiency, near-cryogenic temperature requirement, vacuum chamber necessity, an external magnetic field, and cumbersome emission methods such as the electron gun. The MASER was soon eclipsed in the marketplace and public consciousness by the LASER which became a multi-billion-dollar industry.

The LASER (light amplification by stimulated emission of radiation) was invented in 1960 by Theodore Maiman, based on the theoretical work of Townes and Arthur Leonard Schawlow. The acronym "LASER" was first coined by Gordon Gould in 1957, replacing the previous moniker "optical MASER".

Due to the LASER's convenience (room-temperature operation, non-vacuum conditions, no external magnetic field, and portability), and unique capability to produce coherent radiation in near-parallel rays, a vast assortment of LASER applications became possible throughout the twentieth and twenty-first centuries among numerous fields including science (microscopy, spectroscopy, remote sensing, holography, astronomy, photochemistry, ranging); medical (laser scalpel, cancer treatment, surgery, oral surgery, skin assessments, burn and surgical scar management, cosmetic surgery); industrial (heating and ablating; laser cooling, nuclear fusion); commercial (bar code scanning, computers and compact disc drives, laser pointers); and military (target designation and ranging, countermeasures, communication, and directed energy), to name just a few.

The MASER remained in relative obscurity compared to the laser until 2012 when an organic semiconductor was first used for the gain medium, allowing for room-temperature operation, non-vacuum conditions, and several orders of magnitude improvement in energy expenditure (Oxborrow et al., Nature, 2012).

A temperature-stable MASER oscillator used as a signal generator will significantly reduce noise (two orders of magnitude), significantly narrow the emission frequency linewidth, and provide coherent emission for vastly increased data density.

The new MASER however was no longer tunable in frequency, as the emission output wavelength was now based on inherent physical traits of the gain medium. The new MASER also introduced the risk of the device melting or contorting due to excessive internal waste heat damaging the molecular (plastic) contained within the gain medium, vulnerable at room temperature to the emission process.

Expanded research on the Oxborrow MASER in subsequent years demonstrated continuous wave (CW) emission (Appelt & Sufke, 2016) and provided a method to reduce melting and damage of the gain medium with the addition of a diamond crystal to absorb and redirect waste heat (Liu & Jin, 2016). As of this writing, the MASER has yet to demonstrate parallel beam emission but rather offers a magnetic field strength signal through an output coupler.

Past Problems—Prior Art

The MASER could become as ubiquitous and useful as the LASER, and could make possible disruptive innovations such as long-distance wireless power transmission and ultra-secure communication, if it could be made to overcome the challenges discussed above including greater freedom in frequency selection, ease of frequency tuning, the prevention of waste heat melting or damaging the gain medium, and collimated emission for parallel wave output.

State-of-the-art in MASER technology utilizes an organic semiconductor gain medium which provides the convenience of operation at room temperature and pressure, along with vastly improved power efficiency.

The frequency of emission of the state-of-the-art MASER is limited by the choice of the gain medium, and so cannot be tuned. To the best of our knowledge at the time of writing, no invention has provided a solution to this challenge.

Current state-of-the-art MASER technology utilizes pentacene in a p-terphenyl host crystal for an emission frequency of 1,450 MHz (1.45 GHz).

By comparison, desired frequencies for telecommunication applications such as line-of-sight ground-to-aircraft, aircraft-to-aircraft, land mobile, and maritime mobile communication, include very high frequency (VHF) between 30 and 300 MHz, notably lower than the current state-of-the art MASER.

Further, applications including microwave communications, mobile phones, Bluetooth, ZigBee, GPS and two-way radios such as land mobile, FRS and GMRS radios, and satellite radio are found in the ultra high frequency (UHF) range between 300 MHz and 3,000 MHz (3 GHz). This broad spectrum only intercepts the aforementioned current state-of-the-art for MASERs once and once only, at 1,450 MHz (1.45 GHz).

Additionally, telecommunications applications including modern radars and communications satellites are found in the super high frequency (SHF) range of 3 GHz-30 GHz, far above the current state-of-the-art for the MASER. Further, telecom applications such as high-frequency microwave radio relay, microwave remote sensing, directed-energy military tools, and millimeter wave scanners are found in the extremely high frequency (EHF) band between 30 and 300 GHz, again notably higher than the state-of-the-art for the MASER.

For additional comparison, ideal frequencies for long-distance radiative wireless power transmission might include those which are already reserved worldwide by the International Telecommunication Union (ITU) for purposes other than telecommunication (such as experimental and specialty use) including the Industrial, Scientific, and Medical (ISM) bands. Some frequencies in these ranges are broadly considered ideal for power beaming among the international community of experts, and include 2450 MHz (2.45 GHz) and 5800 MHz (5.8 GHz), both notably high above the state-of-the-art MASER.

An additional challenge of the state-of-the-art for the MASER is that in its current iteration, changing the output frequency would require the use of a different gain medium. The gain medium of the state-of-the-art MASER is not easily interchangeable and would require redevelopment of the device. An entirely new MASER device would likely be required. Multiple devices to achieve multiple frequencies is not a compact, portable, nor cost-effective solution, so the current state-of-the-art of MASERs is not ideal.

A further challenge with the state-of-the-art MASER is that the melting point of the gain medium is so low that normal operation risks system melting. The gain medium to achieve the state-of-the-art MASER is a combination of guest and host molecules, which are in essence plastics. Further, of the energy that is input into a MASER system, only a fraction of it gets emitted as a MASER signal. Therefore, up to 99.9999% of the input energy could be lost as waste heat under typical operating conditions. The MASER pump excites electrons to the first excited singlet state. The electrons lose a small amount of energy when they convert from singlet to triplet state by intersystem crossing. The emission itself represents the dropping of energy levels within the triplet state (5 orders of magnitude smaller than the input energy). The triplet, once it falls to the lower energy state within the triplet sublevel, in time will return to the ground state (wherein the process can repeat from scratch) and the energy from that triplet sublevel is expelled as heat within the gain medium crystal, representing the 99.9999% of lost energy.

Past solutions to cope with this waste heat problem of the state-of-the-art MASER have included integrating a large diamond crystal as essentially a heat sink, excising the waste heat generated within the gain medium. This solution is flawed for at least four reasons: (1) the solution may not be scalable, as a comparably larger or smaller device (as a customer may require) would not necessary be possible because the diamond may not prove as effective at different scales; (2) the solution may not be cost effective as it requires the use of a diamond in each unit; (3) the solution may not be sustainable as the diamond may become a target for theft (regardless of the actual commercial retail value of the diamond), thus destroying/stealing a system in place that is unguarded, and therefore suggesting that additional security costs and obligations would be required for the user to protect the asset; and (4) the solution may not be effective in situations were the device is engaged for long periods of time or is in continual use, because the heat that is generated within the gain medium itself still exists within that object for a period of time, so the diamond might not be able to extract enough heat at a sufficient rate for the intended needs of the customer and would still melt or suffer sufficient damage over time, thus making for an unsustainable product and burdening manufacturers with copious returns. Ultimately, the diamond solution could be viewed as a temporary or stop-gap measure which does not solve the root problem, namely the creation of waste heat.

The state-of-the-art MASER also does not (as of this writing) produce a narrow beam output, but rather offers a signal output through a coupler. A solution for long-distance radiative power transfer and secure communication will require a near-parallel or parallel wave output.

For the room-temperature MASER to be commercially viable, a solution is required which can (1) transmit in desired frequencies for communication or wireless power beaming, (2) significantly reduce waste heat generation to begin with to prevent melting, and (3) offer a narrow (ideally parallel) electromagnetic wave beam output.

Past solutions in telecommunication have proven technically effective at basic operation (radio has been used for over a century). However, broadly transmitted signals have remained vulnerable because they can be detected and, time and resources permitting, decoded. Security has largely been a matter of techniques such as encryption (to protect information that will presumably fall into enemy or competitor hands) or frequency rotation. With both solutions, it is presumed that opponents will find the signal and attempt to decode it. Neither solution provides a means by which the signal cannot be detected at all.

As of this writing, past solutions in wireless power transmission have not yet resulted in widespread commercial implementation. Attempts have included antenna propagation of power beams. The problems encountered were: (1) power levels were too high at beam center compared to existing safety regulations and could lead to serious injury; (2) signals were too broad in directionality and distributed side lobes, and thus would cause harm to off-target persons or assets, or signal interference ("jamming" or "dazzling"). An ideal solution would make possible wireless power transmission across vast distances, within safety regulations, and without causing interfering to off-target persons or assets.

Proposed Solution—Novelty

The present invention improves on the state-of-the-art by offering a MASER which can operate in desired radio and microwave bands; can be tuned as desired to change frequencies; can recycle waste heat to prevent melting or deforming of the internal system to vastly increase lifetime and efficiency and make possible a commercially viable product; and can emit parallel electromagnetic waves for highly efficient and focused power and data transfer.

The present invention offers the methodology for selecting the material ingredients of a gain medium which will emit at the desired frequency in the communication and power-beaming bands discussed above (technology details discussed below).

The present invention will also be tunable to a range of frequencies within a single device, thanks to the variable magnetic field apparatus (technology details discussed below).

The present invention will avoid overheating and so prevent melting and/or other damage by re-pumping the excitons from the lower triplet sublevel to: (a) the upper triplet sublevel, (b) the first excited singlet state, or (c) a higher excited singlet state, thereby preventing the 99.9999% waste heat that would otherwise remain within the gain medium crystal and surrounding system. Technology details discussed below.

With this present invention, the MASER will now: (1) transmit in desired frequencies for communication or wireless power beaming, while (2) significantly reducing waste heat generation, so as to prevent melting, to (3) emit a coherent and parallel signal, and (4) communicate between two or more units to assure and confirm effective and efficient power and data transfer. The present invention will also offer less power consumption than antenna propagation since a signal can be sent directly from point to point without loss due to side lobes.

Further, long-distance wireless power will become safe within regulations, energy-efficient, and thus commercially viable, allowing for numerous disruptive applications: the sending and receiving of power across vast horizontal distances to alleviate the dangers of military convoys and supply lines to reduce casualties, harm, risk, and loss; wireless power sent from regions with abundant solar energy availability to densely populated areas, without requiring the vast infrastructure of roads and powerlines in between; sending power to remote regions such at the Arctic North and the Antarctic south; sending power to islands or other remote regions where cargo and resupply transport by land or air is otherwise too costly, dangerous, or otherwise prohibitive; and sending power from space down to Earth for limitless clean, sustainable, near-baseload renewable solar energy to directly address the problems of climate change and peak energy.

LIST OF DRAWINGS

FIG. 1. Components of MASER system with sample dimensions (not to scale)
The maser apparatus of the present invention, featuring an energy source (pump), resonator cavity, output coupler, and organic semiconductor gain medium to produce a coherent microwave beam emission.

FIG. 2. Components of MASER system
Same essential content as FIG. 1, but with casing dimensions removed to clearly illustrate the inner workings.

FIG. 3. Components of MASER system (in color)
Color version of FIG. 2 to help illustrate the distinct components involved.

FIG. 4. Room-temperature MASER apparatus
Diagram of a room-temperature MASER featuring pump, resonator chamber which contains the cylindrical ring resonator and organic semiconductor gain medium crystal boule, tuning piston and screw to align the chamber dimensions, quartz support ring and polystyrene post to support the resonator and gain medium unit, and coupling loop to facilitate MASER signal output.

FIG. 5. Energy Diagram
This illustration represents the energy levels of the guest molecule within the gain medium throughout the process of stimulated emission and "masing" (MASER emission). An electron will (i) absorb incident energy from the pump (optical or electrical) and become promoted to the first excited singlet state, (ii) undergo intersystem crossing to convert from singlet to triplet energy state and in the process release a small amount of energy, and populate the various triplet sublevels and, given proper selection of the guest and host molecules, provide a population inversion wherein the majority of excited and unpaired electrons (excitons) will be located at the higher triplet energy state, (iii) upon triggering fall from the highest to the lowest triplet energy level, and in the process emit the excised energy as an electromagnetic wave at the desired frequency (masing), (iv) rather than falling back down to ground state and losing the majority of its energy as waste heat within the gain medium crystal, (v) upon activation and reversal of the polarity of the magnetic field, be re-pumped up to a higher energy level, allowing the masing process to repeat without losing the vast majority of its energy as waste heat.

FIG. 6. Frequency Tuning
A subcomponent of the present invention, featuring an apparatus (in this example an electromagnetic) for (i) distinguishing ("splitting") the triplet sublevels to the desired separation distance apart, thus allowing for frequency tuning. Adjoining is the corresponding energy diagram illustrating the change taking place.

FIG. 7. Exciton Re-Pumping
A subcomponent of the present invention, engaged after (i) the excitons have dropped from the upper to the lower triplet state to conduct masing, which will feature a method of reversing polarity of the electromagnet (in this example a DPDT switch) to reverse the current flow and thus (ii) re-pump the triplet excitons to a higher excited state to allow (iii) the masing process to repeat, without (iv) losing the majority of the exciton's energy as waste heat within the gain medium. The polarity reversing device could be manual or automatic as per customer needs.

FIG. 8. Multi-Unit Arrangement
A configuration of multiple MASER units can be distributed at set intervals apart, to increase the total output efficiency of the transmitting region without requiring an increase in output power for a single MASER unit, nor needing to exceed safety regulations for energy density. Units could be aimed so as to (i) remain parallel, or (ii) converge at a common target. Separation distance can be chosen so as to assure that each emission wave does not destructively interfere with any adjacent wave. A known separation distance in industry for microwave antenna propagation is 0.8*lambda (lambda being the wavelength of emission, which is the speed of light (in m/s) divided by the frequency in Hz. Each MASER unit could be tunnel-like as shown in the illustration, or much narrower (as small as the components will allow) so as to create for a very flat, flexible device. A series of MASER units could be woven to form a panel which could be flexible, bendable, and rollable.

DETAILED DESCRIPTION

Detailed Description: Overview

The function of the present invention is to provide MASER emission for longer periods of time than state-of-the-art, within risk of melting or deforming the gain medium by preventing the accumulation of waste heat within the gain medium of the MASER; to offer a wide array of frequency choices along with frequency tuning capability for customers for wireless communication and wireless power transmission needs; and to provide a coherent and parallel signal for highly efficient and controlled transmission.

The present invention consists of the following components:
  (1) a MASER (microwave or molecular amplification by stimulated emission of radiation) that can operate effectively in environments as warm as (but not limited to) typical room temperature and pressure, and which can be comprised of some, most, or all of the following:
    (i) pump to provide energy through electricity or electromagnetic waves,
    (ii) a resonator cavity,
    (iii) an output coupler,
    (iv) supporting structural material to assure rigidity and optimal performance including, but not limited to housing, support rings, support posts, frames, casings, and containers, and
    (v) a gain medium of guest and host molecules selected and configured so as to allow for emission in desired frequencies such as those widely recognized for wireless communication (between 3 MHz and 300 GHz) and those desired for wireless power transmission (including but not limited to 2.45 GHz and 5.8 GHz);
  (3) an apparatus and method for absorbing energy such as (but not limited to) harnessing ambient light (including but not limited to solar radiation) and storing such light for purposes of generating a sufficient charge to provide a pump source for the MASER;
  (4) an apparatus and method for adjusting the value of the energy gap between the lowest and highest triplet sublevels of the gain medium at will so as to allow for rapid frequency tuning as desired, such as with an electromagnet;
  (5) an apparatus and method for re-pumping excitons from the lower triplet sublevel to a higher energy level including, but not limited to, (a) a higher triplet sublevel, (b) the first excited singlet state, or (c) a higher excited singlet state to recycle already-elevated excitons and conserve the vast majority of their energy from being lost as waste heat within the system;
  (6) an apparatus and method for collimating output energy as parallel or focused electromagnetic waves, at high power levels as desired, and in pulsed or continuous wave operation;
  (7) an apparatus and method for steering waves in desired directions;
  (8) an apparatus and method for tuning emission frequency;
  (9) an apparatus and method for digital control;
  (10) a method for enabling two or more devices to exchange meta-information with one another, including but not limited to geographic coordinates, angle of orientation, velocity, acceleration, yaw, pitch, and roll, in order to directly and efficiently exchange electromagnetic waves among one another without misdirection or loss of signal. This could also enable multiple sender units to transmit to a single receiver unit, allowing for greater power transfer than would otherwise be within safety regulations of energy density for a single sender-receiver pairing, whilst never exceeding regulations for any one single transmitter.

The present invention could be deployed in either one, several, or multiple units, arranged in a wide variety of possible configurations to arrive at the desired output power level such as (but not limited to) multiple MASER units placed near one another, multiple MASER units integrated within or affixed to a single tile, and multiple tiles integrated within or affixed to a single panel.

Detailed Description: Room-Temperature MASER

Regarding the room-temperature MASER, a thorough explanation of the masing process at the molecular level can be found in (van Wynsberghe and Turak, 2017). Details required for device construction are as follows:

The MASER converts an input of electrical or optical energy into a coherent emission of photons. The electrons migrate to higher orbital levels if the atoms are "pumped," that is, receive energy from an external source. As those electrons lose their energy (after 10-8 seconds), they emit photons by emission and retreat to a lower energy level.

When this process occurs naturally it is referred to as spontaneous emission, whereas if it occurs by design it is called stimulated emission. Stimulated emission occurs when a photon strikes an electron already suspended at an excited state level: the electron releases its energy and the exiting photon will be in phase with the striking photon. That is, the two photons will travel away coherently, with the same wavelength, frequency, and vector.

Key to coherent emission is the maintenance of stable population inversion. The pump must keep a greater percentage of electrons at the excited states, at a rate faster than the natural relaxation rate of the electrons back down to the ground state. Excited state electrons must maintain their stimulated position long enough to allow incident photons to strike and cause coherent cascade emission.

One method for constructing an optimal MASER that operates at room temperature is by using a gain medium that provides long excited state lifetimes and natural energy sublevel division (zero-field splitting) such as an organic semiconductor. Despite having low mobility and complex transport properties, organic semiconductors have significant advantages over inorganic semiconductors as a gain medium.

The mechanism of electron transport in organic semiconductors makes them advantageous as a gain medium. Semiconduction in organic molecules occurs in a $\pi$-conjugated system, where $\pi$ orbitals are delocalized over some or all of the molecules. Transport of electrons through the $\pi$-orbital electrons also further suppress both SOC and the hyperfine interaction ("HFI", the interaction between electron spin and the adjacent atomic nuclei).

Emission lifetimes can be substantially longer in organic system than those observed in inorganic systems, as both singlet and triplet states in organic semiconductors result from room-temperature stable exciton spin pairs. Organics feature microseconds instead of mere pico or nanoseconds. In some aromatic molecules, lifetimes have been observed as high as milliseconds or even full seconds. The long lifetime in organics is due to the weak spin-orbit coupling (SOC), as a result of the low molecular weight of the materials involved, such as carbon and hydrogen in small molecule arrangements (low Z value) or π-conjugated polymers.

A further contributor to the long lifetime in organics is the formation of the triplet exciton state, which is quantum mechanically forbidden to decay to the ground state. Emission from such a gain medium is based on optical excitation into the dipole-allowed singlet state, followed immediately by an intersystem crossing to the metastable triplet state, and then a return to the ground state (often through phosphorescence). Materials which additionally have non-degenerate triplet states can, as an intermediate step, have transitions between triplet states which can produce the required microwave emission (see diagram of FIG. 2).

Organics are generally cost-effective, easy to fabricate and test, versatile, flexible, plentiful, and lightweight. Spin manipulation in organics (for improved optoelectronic devices, spintronics, and spectroscopy) also has a long history. There are many candidate materials to investigate across the vast spectrum of organic molecules, providing numerous choices for applications.

The organic MASER functions by photoexciting a solid-state gain medium composed of an organic guest molecule within a solid polymer crystal (which taken together comprise a Shpolskii matrix) and then emitting photons by exciton decay within the triplet sublevels. Radiative emission is then guided and amplified by a resonance cavity to form a coherent pulsed or continuous maser beam. Dispersing a small amount of the guest molecule (to be excited) within the polymer host matrix (to remain dormant) separates the guest molecules from one another to prevent quenching. Additionally, incorporating the guest into a host matrix frustrates the rotational degrees of freedom of the guest and splits the usually degenerate triplet states, allowing microwave emission at room temperature.

The MASER assembly including, but not necessarily limited to, the pump, gain medium, resonator cavity, and emission coupler can be assembled in numerous configurations, as discussed for example in WO2014027205A2 (Oxborrow, 2012) and its derivatives, or as in US20170077665A1 (Liu & Jin, 2016). A person with ordinary skill in the arts of mechanical engineering, specifically in microwave cavity resonators, microwave circuitry and microwave waveguide electronics should be able to construct the assembly. A person with ordinary skill in the art of coherent radiative emission and stimulated emission should be able to test the effective operation of the device.

The gain medium ingredients including the guest and host molecule should be selected and assembled so as to satisfy the following criteria for emission in radio and microwave bands:

(i) Photo-Emission from the Triplet State

A guest molecule in the gain medium must offer stimulated emission which can be harnessed for masing activity. For the low energy levels desired (compared to lasers), the ideal emission should be that expunged from the drop occurring between the highest and lowest triplet sublevels. The molecule could be of such geometry that it is nondegenerate in its natural state at room temperature and so offers a distinct splitting of the triplet sublevels without external magnetic field intervention, as pentacene in p-terphenyl offers in the state-of-the-art MASER. However, with the novel addition of the magnetic field generation apparatus and polarity reversing apparatus in the present invention candidate materials could be chosen of such molecular symmetry that do not distinguish between the highest and middle triplet sublevels as they could be separated by the applied magnetic field, thus widening the pool of candidates further.

One such option discussed in van Wynsberghe and Turak (2017) and quantified by Thomson (1968) is coronene, hosted in the plastic Poly(methyl methacrylate) or PMMA. Coronene is a planar symmetric molecule with degeneracy in two out of three degrees and so is without natural triplet splitting. However, with an applied magnetic field can deliver a value of D/hc ranging from 0.096 to 0.093 (cm^-1) and no E value (due to the symmetry of the molecule) which results in emission frequencies experimentally derived as between 2.79 and 2.87 GHz.

(ii) Emission at or Below the Target Frequency

A guest and host molecule combination should be chosen such that the frequency matches the intended minimum threshold that the customer would desire. One candidate example from van Wynsberghe and Turak (2017) is the organic semiconductor Fluoroanthene which, from within a host of PMMA at the appropriate mixture ratio, will emit at 2.449 GHz, ideal for intended applications at 2.45 GHz such as wireless power transmission and many other localized applications.

An added advantage of the organic semiconductor MASER and with the approach of the present invention is that the frequency can be further adjusted from within the device, without replacing the gain medium. Due to the Zeeman effect, some organic materials which emit at a lower frequency than the one desired could also become viable candidates with the application of a modest external magnetic field to widen the triplet energy gap and thus raise the value of the output frequency. One example from van Wynsberghe and Turak (2017) is Triphenylamine in PMMA which naturally emits at 2.401 GHz. With the application of a magnetic field, the energy gap between highest and lowest triplet sublevels would be widened, and this molecule could then emit at the desired frequency of 2.45 GHz.

(iii) Relative Population Inversion in the Triplet Sublevels

For masing action, a system must have a top-heavy population imbalance with more excitons in the upper states than lower states, with plenty of openings among the lower states where excitons of higher energy can decay down. Among organic molecules, numerous examples exist of high ratio excitons in the highest triplet sublevel, compared to vastly smaller populations in the middle and lowest triplet states. Pentacene in p-terphenyl, used previously in the state-of-the-art MASER, has a demonstrated a ratio of 0.76:0.16:0.08 relative population in the TX:TY:TZ sublevels. Other examples of notable population inversion presented by van Wynsberghe and Turak (2017) include Naphthalene guest molecules within a Naphthalene-d8 (deuterated) host matrix, which produces a population inversion of 0.82:0.16:0.02, even greater than that of pentacene in p-terphenyl.

Additionally, the novel addition of the magnetic field generation apparatus and polarity reversing apparatus of the present invention could make possible the selection of candidate materials with a less than ideal population inversion, thus widening the pool of candidates even further to include (but limited to) those listed in (van Wynsberghe and Turak, 2017).

(iv) Triplet Lifetime

Population inversion must be maintained consistently for a long period of time in order to permit stimulated emission and masing action. Organic semiconductors offer significant advantage in this regard because they create a metastable triplet state through intersystem crossing from the excited singlet. Such excitons are dipole forbidden from decaying back down to the ground state due to the total spin moment S=1. As Pauli exclusion forbids two electrons with parallel spins from occupying the same orbital, triplet excitons cannot decay to the ground state without spin flipping, phosphorescence, or non-radiative phonon perturbation. It can take significant time for those conditions to be met (nanoseconds for pentacene and full seconds or tens of seconds for other organic molecules) and for the exciton to relax to the ground state. One option from van Wynsberghe and Turak (2017) which displays a significantly long triplet lifetime is the aforementioned coronene in PMMA, which has been demonstrated to sustain for at least 56 seconds, vastly longer than pentacene in p-terphenyl in the state-of-the-art MASER which offered 135 µs (microseconds).

Additional examples of candidate materials and further details on how best to select and assemble candidates can be found in (E. van Wynsberghe and A. Turak, 2017). A person with ordinary skill in the art of organic semiconductor device physics, specifically in spin transport electronics (or "spintronics"), electron and exciton energy levels, intersystem crossing, triplet sub-level spin manipulation, fluorescence, and phosphorescence should be able to select the ideal candidate materials. A person with ordinary skill in the arts of laboratory procedures, vacuum chamber use, semiconductor doping, and organic crystal or thin film manufacture should be able to construct the gain medium. A person of ordinary skill in the art of electron paramagnetic resonance/electron spin resonance techniques should be able to test the efficacy of the gain medium.

The apparatus and method for producing and maintaining a magnetic field to affect the energy gap between triplet sublevels within a microwave resonator cavity has been discussed and demonstrated prior in the literature including, but not limited to, sources such as: U.S. Pat. No. 3,013,214A (Damon, 1957), U.S. Pat. No. 2,929,922A (Schawlow and Townes, 1958), U.S. Pat. No. 3,214,630A (Helmer, Sturrock, Hodges, 1959) and van Wynsberghe and Turak (2017). By applying an electric field, the electric dipole moment in the molecules can be used to separate the two molecular configurations. As the α and β spin states respond oppositely to an applied magnetic field, the Zeeman effect results in a tunable energy separation of the two spin states, which increases proportional to the applied magnetic field according to the expression:

$$E = g\beta M\_s H$$

where g is the electronic g factor, β is the Bohr magneton, M_s is the spin quantum number, and H is the applied field. Thus, through the application of a magnetic field, a stable population inversion can be maintained within the triplet sublevels at the desired energy separation level, which will subsequently provide emission at the desired frequency. A person with ordinary skill in the arts of mechanical and/or electrical engineering, specifically in electromagnetics should be able to construct, operate, and test this subcomponent.

The magnetic field generator apparatus should also be equipped with a dial to adjust the amount of electric current that flows through the apparatus, so as to adjust the degree of separation between the triplet sublevels and thus to directly determine the frequency of emission. A person with ordinary skill in the arts of mechanical and/or electrical engineering, specifically in electromagnetics should be able to construct, operate, and test this additional control element.

The apparatus and method for reversing the polarity of the electromagnet at desired intervals can include a commutator, switch, double pole double throw (DPDT) switch, series of switches, or the installation of two separate electromagnets on opposing sides of the gain medium. Such a direct polarizing magnet apparatus can be mounted in or near the microwave cavity so as to expose the gain medium to orthogonally or perpendicularly arranged magnetic fields.

The operation of the polarity switch is such that it can toggle between two binary positions which we can label for example purposes: position A, and position B. When in position A, the magnetic field would be aligned such that it would separate the triplet sublevels in such a way that the divisions were X (highest), Y (middle), and Z (lowest). Contrastingly, if the toggle were switched to position B, then the change in direction of the electric current would cause a reversal of the magnetic field and subsequently reverse the energy levels of the triplet sublevels, such that the levels would now be Z (highest), Y (middle), and X (lowest), or some other such similar change in triplet energy levels. Excitons which were previously at the lowest triplet level would now be elevated, depending on a variety of factors including by not limited to the amount of energy imparted, and the relationship between the host and guest molecules in the gain medium, up to a higher energy level, including but not limited to (i) the highest triplet sublevel, (i) the first excited singlet state (by reverse of intersystem crossing) or (iii) a higher singlet or triplet state.

In the configuration of position B, the excitons would now be in a state of population inversion, or in the singlet excited state and so ready for intersystem crossing to produce said population inversion. Masing action could again take place, however with excitons that never fell back down to ground state and so never lost 99.9999% of their energy as waste heat within the gain medium crystal. Upon completion of a masing emission, this toggle process could be reversed, back to position A, and the cycle could repeat itself. The alternation could be performed automatically in a repeating fashion so that the system is continually recycling triplets from the lowest excited triplet state to a higher state, thus continually preventing excitons from dropping down to ground state and never giving up the vast majority of their energy as waste heat.

The output power of the device will depend on a variety of factors including the input power, the guest and host molecules in the gain medium, the Q-factor of the resonator, among others. More output power can be provided by improving each of the aforementioned elements, or by developing a series of MASER units dealt in intervals. FIG. 5 illustrates. Each MASER unit can be directed to a specific target, or aimed in parallel, such that the receiver/target receives an energy in point sources at corresponding intervals.

The novelty of the polarity reversal is such that thermal management can be performed without the addition of a diamond crystal or other absorbing material, ensuring that heat is never generated in the first place rather than depending on a heat sink or other heat removal technique.

The novelty of the variable electromagnet producing a magnetic field at will is that the present invention can provide frequency tuning, allowing sales of a single unit for multiple functions, and allowing a customer to vary the field as desired during operation, for added communication security.

The novelty of the total present invention overall, is the combination of the aforementioned components, each from disparate fields of expertise, and the specialized knowledge to select the ideal candidate gain medium materials and prepare for assembly, to produce a unified whole and unique invention that will improve the performance of the organic room temperature MASER such that it will be resilient over the long-term, tunable in frequency for various customer needs, emitted in a coherent and parallel beam, and thus commercially viable.

Detailed Description: Adjusting the Energy Gap

Applying a magnetic field, possibly external to the gain medium but possibly integrated, can align the spin of the guest particles so as to assure triplet sub-level division of the desired magnitude, a widely used methodology in this industry. Methods are discussed in the next immediate sub-section.

Detailed Description: Re-Pumping Excitons

In the present invention, excitons after undergoing photon emission and dropping the lowest triplet sub-level are to be re-energized up to the higher triplet sub-level, also by engaging a magnetic field. In this instance, the magnetic field can be reversed in polarity, or another magnetic field can be engaged in a perpendicular or opposing manner so that all of the lower-level excitons will find themselves at a state of increased magnetic energy and thus in the higher state, while those few excitons (if any) remaining in the previously-highest triplet sub-level will now find themselves at the lowest triplet sub-level. This reversal of population will essentially reset the device, creating a situation where the upper level is now re-populated with a population inversion, and is ready to undertake the masing action again.

This re-pumping ("recycling") of excitons will allow reuse of the already-excited excitons to conserve energy, while also preventing exciton collapse back down to ground state and so preventing 99.9999% of the exciton energy from being lost within the system as waste heat and thus preventing system overheating, melting, and device malfunction.

Such apparatus and method could include (but is not limited to) an electromagnet and a means to reverse the polarity of the electromagnet at desired time intervals, with examples including but not limited to a commutator, switch, double pole double throw (DPDT) switch, series of switches, or by installing two separate electromagnets on opposing sides of the gain medium (among other options).

Such apparatus and method could also include (but is still not limited to) a comparatively new method for generating magnetism such as applying an electric field to a stacked monolayer sheet of graphene upon a bilayer sheet, twisted by about 1 degree (or number of degrees which achieves desired results). The direction of the magnetization can be switched by electrostatic doping at zero magnetic field. Such an apparatus could help reduce size, mass, and power consumption of a magnetic field generator for use in the present invention.

It should be emphasized that the means of generating the magnetic field only matters in that it can effectively produce said magnetic field to provide for a separation of triplet sub-levels and to reverse polarity in a controlled manner so as to re-pump and invert the triplet spin population when desired.

Detailed Description: Ambient Energy Absorption Method

The present invention includes a method to absorb ambient electromagnetic radiation (including but not limited to sunlight or lights) and accumulate it, to serve as a pump source of more intensity than a single incident strike of the ambient source would offer. By this means, the MASER gain medium component within the present invention can be directly pumped by ambient artificial light or sunlight.

Examples of methods to trap and accumulate light include (but are not limited to): active optical waveguides with single-negative materials, plasmonic waveguides, and metamaterials. Examples of instructions for assembly, implementation, and testing are provided by (Lu 2010), (Tsakmakidis 2010), and (Tsakmakidis 2014) respectively. To integrate into the present invention, affix such that the absorption apparatus wave guide shares an input terminal to the resonator chamber such that one or both pump sources can be used. This method can serve as an auxiliary pump source and is not vital, but can provide an additional, resilient, or complimentary pump source to further reduce energy budget.

Detailed Description: Focusing Lens for Parallel Output

For parallel beam emission the present invention includes a metamaterial lens, which offers highly efficient plane wave output, meaning electromagnetic energy is concentrated around the normal with very little (if any) side lobes and/or beam divergence (ie. Far field angle of zero). The physical dimensions of the transmitter become the dimensions of the beam itself, allowing for very small, lightweight, and portable devices.

The literature has shown such metamaterial lenses emitting parallel waves. Very early iterations of the device in 2002 (Enoch et. al,) offered Directivity superior to all antennas (except only for large dish antennas), with values of at least 372 and up to 500 for some; and more recently with 3 dB directionality of less than 4.5 degrees, comparable to typical dish antennas. This type of device represents a game-changer for communication, in that messages can be sent directly to target in a narrow path, without any spill or beam width expansion, ensuring that only the target receives the information. We are very excited about these developments and the opportunities they represent.

The receiving instrument can be either (a) a traditional receiver (ie. radio) or (b) another metamaterial lens (appended to a conventional radio, discussed herein) which can receive in narrow direction, or (even better) can receive in a wide arch but re-transmit back to original sender in an equally narrow beam to the signal originally sent.

A metamaterial lens can be impedance-matched to free space, resulting in highly directive microwave emission. Method demonstrated by (Cheng et. al 2010).

A phase-field design process can optimize configuration of a metamaterial collimator for both parallel and focused beams. Method demonstrated by (Kim et. al. 2016).

Detailed Description: Focal Length

The metamaterial lens can be fashioned to provide emission focused down to a single point at a distance of choice. Such a feature would allow for greater power density at a single point, reducing the necessary size the receiving unit (to add convenience if using in a remote operation, distant location, or requiring less carrying weight). To that end, hyperbolic metamaterial lenses have been demonstrated for collimating and sub-wavelength focusing by (Ren et. al, 2018). Techniques such as "time reversal" can amplify evanescent waves out of the near-field and into the far field.

With this approach, groups such as Fink et. al (presented by Day, 2007) have focused microwaves onto a spot size that is a mere 1/30 (one thirtieth) of a wavelength in width.

Detailed Description: Frequency Tuning

Emission frequency can be tuned within the metamaterial slab itself, as seen through works such as (Maier, 2017) and (Nicholson, 2011), and in U.S. Pat. No. 8,421,706B2 (Lee, 2013). Combined with the frequency-tuning capability introduced in the present invention for the MASER oscillator/signal generator, the overall device would be capable of frequency tuning on demand in both signal generator and emitter.

Detailed Description: Beam Steering

A metamaterial lens can achieve broadband beam-steering, allowing for it to replace directional antennas with their corresponding mechanical moving parts vulnerable to deterioration and weather damage, or complex phased arrays, to instead offer a spectrum of steerable transmission frequencies with reduced complexity and cost. Methods demonstrated by (Kundtz et. al, 2009).

Detailed Description: Digital Control

Digital control of metamaterial properties can be integrated to allow for switching of the lens direction in real-time. Methods have been shown by (Cui et. al, 2017).

Detailed Description: High Power Emission

High-power signal emission can be achieved. An all-metal backward-wave oscillator (BWO) metamaterial has been shown to produce a pulse lasting 350 nanoseconds with a peak power of 2.1 Megawatts. A demonstration (along with methods) was provided by (Hummelt et. al, 2016), wherein emission was shown at 2.4 GHz, an ideal microwave frequency within an Industrial, Scientific, and Medical (ISM) bands for activities such as long-distance wireless power transfer. A metamaterial waveguide can also substitute for a conventional microwave oscillator's periodic slow wave structure (SWS) to generate high power microwave radiation. Methods demonstrated by (Seidfaraji et. al, 2019).

Detailed Description: Convenient Manufacture

A metamaterial lens can be constructed to be ultra-thin and flat, for light-weight, low-cost, easily deployable transmitters for microwave communication, detection, imaging, and power beaming. Methods demonstrated by (Azad et. al, 2017).

Detailed Description: Receivers

Metamaterial absorbers in microwave frequencies can provide ultra-broadband receivers. The literature has demonstrated a relative FWHM absorption bandwidth of 79.5 degrees and an absorption ratio of over 83%. Such a unit is more valuable to the present invention because it is easier to fabricate and more suitable for practical application than conventional parabolic antennas, and offers smaller unit size, slimmer structural thickness, more convenient procedures, and cost-effective fabrication. Methods demonstrated by Xin et. al, 2017). This omnidirectional absorption with metamaterials, a sort of "electromagnetic black body" which will allow for signal reception regardless of aim will be especially valuable for operators in the field when needing to find a signal from base, or providing the advantage of moving and communicating without needing to worry about antenna steering to provide more agility and less cognitive load.

Wideband and all-angle highly-directive emission and reception can be achieved with a metamaterial lens for transmitter or receiver. Methods demonstrated by (Ren et. al, 2019). This will enable a receiver unit to receive from multiple directions at the same time, allowing a receiver to accept messages from multiple senders, or receive power from multiple transmitter units at varying directions and distances away.

Detailed Description: Modeling and Digital Design

Advanced modeling tools for metamaterial lens design include those which study a single particle in free space to predict behavior of a whole metamaterial lattice. This reduces cost and time in studying, while also allowing for miniaturized meta-atom designs rather than whole meshes; managing of chiral effects; and selection of the best design for any application. Methods demonstrated by (Klotz, 2020).

Detailed Description: Improvements

Improvements can be made over existing metamaterial lens designs. An active metamaterial with simultaneous gain and negative refraction index (NRI) in the microwave regime can function as a laser-like amplifier by doping fishnet metamaterial cells to compensate (or even overcompensate) for intrinsic losses found in traditional metamaterials. Methods demonstrated by (Ye et. al, 2014).

Detailed Description: Lens Coupling to MASER Oscillator

The MASER and lens can be coupled by feeding the MASER output coupler directly into the layers of the metamaterial lens. Instructions for introducing a signal feed into a metamaterial lens are provided throughout the literature on metamaterial lenses including those referenced in this document.

Applications

The present invention allows for coherent and parallel electromagnetic emission in radio and microwave frequencies to transmit and receive information and electrical power. Applications could include (but are not limited to):
1. Wireless power transmission across vast distances (such as to and from land, sea, air, high-altitude, and space), including serving as an improved wireless power transmission method for prior art;
2. Communication (including but not limited to voice, moving and still imagery, and holography) and data transfer across vast distances (as described above), through a signal which cannot be detected nor intercepted by anyone outside of the narrow beam path, thus offering vastly improved privacy and security;
3. Medical scanning for clinical diagnosis with lower energy intensity (Watts/m^2) compared to lasers, and tunable to desired radio and microwave frequencies; and
4. Remote sensing, instead of traditional radar or RFID technologies, among other options.

REFERENCES

U.S. Pat. No. 3,013,214A Microwave maser amplifier (Damon, 1957)

U.S. Pat. No. 2,929,922A Masers and maser communications system (Schawlow and Townes, 1958)
U.S. Pat. No. 3,214,630A Molecular beam maser (Helmer, Sturrock, Hodges, 1959)
US20070001773A1 Whispering gallery oscillator (Oxborrow, 2005)
WO2014027205A2 Maser assembly (Oxborrow, 2012)
WO2014027205A3 Maser assembly (Oxborrow, 2012)
U.S. Pat. No. 8,421,706B2 Metamaterial microwave lens (Lee, 2013)
U.S. Pat. No. 9,608,396B2 Maser assembly (Oxborrow, 2014)
WO2017114703A1 CW maser having an electromagnetic resonant circuit (Appelt & Sufke, 2016)
US20170077665A1 Diamond maser and microwave amplifier (Liu & Jin, 2016)
Einstein, A. "On the quantum theory of radiation Z." Physik. Mar. 3 (1917).
Azad, A. K., Efimov, A. V., Ghosh, S., Singleton, J., Taylor, A. J., Chen, H. T. Ultra-thin metasurface microwave flat lens for broadband applications, Applied Physics Letters. 110 (2017) 224101. doi:10.1063/1.4984219.
Cheng, Q., Jiang, W. X., Cui, T. J. Radiation of planar electromagnetic waves by a line source in anisotropic metamaterials, Journal of Physics D: Applied Physics. 43 (2010) 335406. doi:10.1088/0022-3727/43/33/335406.
Cui, T. J. Microwave metamaterials—from passive to digital and programmable controls of electromagnetic waves, Journal of Optics. 19 (2017) 084004. doi:10.1088/2040-8986/aa7009.
Day, C. Time-reversed microwaves beat the diffraction limit, Physics Today. 60 (2007) 15-18. doi:10.1063/1.2731958.
Enoch, S., Tayeb, G., Sabouroux, P., Guerin, N., Vincent, P., A Metamaterial for Directive Emission, Physical Review Letters. 89 (2002). doi:10.1103/physrevlett.89.213902.
Hummelt, J. S. High power microwave generation using an active metamaterial powered by an electron beam. Thesis, Massachusetts Institute of Technology, 2016.
Kim, H., Park, J., Seo, I., Yoo, J. Two-dimensional dielectric collimator design and its experimental verification for microwave beam focusing, Applied Physics Letters. 109 (2016) 151902. doi:10.1063/1.4964604.
Klotz, G., Mallejac, N., Enoch, S. Bi-anisotropic homogenization of metamaterials, Pre-Print. (2020). https://hal.archives-ouvertes.fr/hal-02533037/(accessed Apr. 8, 2020).
Kundtz, N., Smith, D. R. Extreme-angle broadband metamaterial lens, Nature Materials. 9 (2009) 129-132. doi:10.1038/nmat2610.
Lu, W. T., Huang, Y. J., Casse, B. D. F., Banyal, R. K., and Sridhar, S., "Storing light in active optical waveguides with single-negative materials," Appl. Phys. Lett., vol. 96, no. 21, p. 211112, May 2010, doi: 10.1063/1.3431574.
Maier, S. A., ed. World Scientific handbook of metamaterials and plasmonics, World Scientific, New Jersey, N J, 2017. Chapter 9: Tunable Metamaterials, 16, 387.
Nicholson, K., Rowe, W., Ghorbani, K. Design and demonstration of a metamaterial with electronically tunable negative refraction across the C microwave band, IET Microwaves, Antennas & Propagation. 5 (2011) 631. doi:10.1049/iet-map.2010.0484.
Oxborrow, M., Breeze, J. & Alford, N. "Room-temperature solid-state maser". Nature 488, 353-356 (2012). https://doi.org/10.1038/nature11339
Ren, M., Liu, Y., Dong, L., Liu, L., Deng, F., Shi, Y. L. Hyperbolic Metamaterials for Collimation and Subwavelength Focusing, 2018 11th UK-Europe-China Workshop on Millimeter Waves and Terahertz Technologies (UCMMT). (2018). doi:10.1109/ucmmt45316.2018.9015757.
Ren, M., Liu, Y., Yu, S., Dong, L., Liu, L., Deng, F., et al. Wideband directive emission based on hyperbolic metamaterials, The European Physical Journal Plus. 134 (2019). doi:10.1140/epjp/i2019-12745-4.
Seidfaraji, H., Elfrgani, A., Christodoulou, C., Schamiloglu, E. A multibeam metamaterial backward wave oscillator, Physics of Plasmas. 26 (2019) 073105. doi:10.1063/1.5100159.
Thomson, Colin. "Electron spin resonance studies of the triplet state." Quarterly Reviews, Chemical Society 22.1 (1968): 45-74.
Tsakmakidis, K. L., Pickering, T. W., Hamm, J. M., Page, A. F., and Hess, O., "Completely Stopped and Dispersionless Light in Plasmonic Waveguides," Phys. Rev. Lett., vol. 112, no. 16, p. 167401, April 2014, doi: 10.1103/PhysRevLett.112.167401.
Tsakmakidis, K., Boardman, A., and Hess, O., "Nature: Trapped Rainbow Storage of Light in Metamaterials," Nature, vol. 450, pp. 397-401, December 2007, doi: 10.1038/nature06285.
van Wynsberghe, E. and Turak, A. Candidate Materials as Gain Media in Organic, Triplet-Based, Room-Temperature Masers Targeting the ISM Bands. 12 Jul. 2017. DOI: 10.5772/intechopen.68232.
Xin, W., Binzhen, Z., Wanjun, W., Junlin, W., Junping, D. Design and Characterization of an Ultrabroadband Metamaterial Microwave Absorber, IEEE Photonics Journal. 9 (2017) 1-13. doi:10.1109/jphot.2017.2700056.
Ye, D., Chang, K., Ran, L., Xin, H. Microwave gain medium with negative refractive index, Nature Communications. 5 (2014). doi:10.1038/ncomms6841.
Zhang, H., Jiao, Z., Mcleod, E. Tunable terahertz hyperbolic metamaterial slabs and super-resolving hyperlenses, Applied Optics. 59 (2020) G64-G70. doi:10.1364/ao.391952.

The invention claimed is:

1. An improved maser of the type producing an output signal and having a pump and resonator chamber containing a gain medium, the gain medium comprising molecules capable of excitation to one or more excited singlet states wherein excitons are present and further being capable of undergoing inter-system crossing to a triplet state having three sub-levels, the improvement comprising: apparatus for re-pumping excitons from the triplet state to either a higher triplet sub-level or to one of the excited singlet states
   wherein a coupler, disposed in a meta-material, receives and conditions the output signal to a focused point or a parallel beam.

2. The improved maser according to claim 1, wherein the apparatus for re-pumping excitons comprises an electromagnet.

3. The improved maser of claim 2, wherein the polarity of the electromagnet switches at a rate faster than the lifetime of the excitons.

4. The improved maser of claim 2, wherein the strength of the magnetic field produced by the electromagnet is varied to tune the frequency of the output signal.

5. The improved maser of claim 1, further comprising apparatus to absorb ambient or pumped electromagnetic radiation and deliver same to the gain medium at a higher intensity than the pump.

6. The improved maser of claim 1, wherein the operating temperature is about room temperature.

7. The improved maser of claim 1, wherein a coupler, disposed in a meta-material, receives and conditions the output signal to a focused point or a parallel beam.

8. The improved maser of claim 1, further comprising apparatus to electronically steer the conditioned output signal.

9. Apparatus comprising:
a plurality of masers each of the type producing an output signal and having a pump and resonator chamber containing a gain medium, the gain medium comprising molecules capable of excitation to one or more excited singlet states wherein excitons are present and further being capable of undergoing inter-system crossing to a triplet state having three sub-levels, each comprising apparatus for re-pumping excitons from the triplet state to either a higher triplet sub-level or to one of the excited singlet states; and
one or more couplers disposed in a meta-material, the couplers receiving the output signals of the masers and conditioning the output signals to converge on a point or to produce a parallel beam.

10. Apparatus according to claim 9, wherein the masers are disposed in an array.

11. Apparatus according to claim 10, wherein the array is planar or spherical.

12. Apparatus according to claim 9, further comprising apparatus to electronically steer the conditioned output signal.

13. Apparatus comprising:
a maser producing an output signal and having a pump and resonator chamber containing a gain medium, the gain medium comprising molecules capable of excitation to one or more excited singlet states wherein excitons are present and further being capable of undergoing inter-system crossing to a triplet state having three sub-levels, the maser comprising apparatus for re-pumping excitons from the triplet state to either a higher triplet sub-level or to one of the excited singlet states; and
a meta-material configured to receive the output signal from the maser;
a power meter coupled to the meta-material and adapted to determine if the output signal has been reduced or otherwise compromised in transit; and
a radio coupled to the power meter and adapted to transmit a control signal to the maser,
the maser further being adapted for control by the control signal.

14. A maser comprising: a pump; a resonator chamber containing a gain medium, the gain medium comprising molecules capable of excitation to one or more excited singlet states and under going inter-system crossing to a triplet state with two or more sub-levels; and an apparatus for re-pumping excitons from the lower triplet sub-level to an intermediate energy state, distinct from the auxiliary levels of the triplet state, and subsequently to one of the excited singlet states, wherein re-pumping mechanism includes a secondary electromagnetic mode that operates at a frequency resonant with the transition from the lower triplet sub-level to the intermediate energy state, and the strength of the secondary electromagnetic field is adjustable to optimize the transition efficiency, further comprising apparatus to absorb ambient or pumped electromagnetic radiation and deliver it to the gain medium at an intensity sufficient to maintain the desired excitation states for continuous operation.

15. A maser comprising: a pump; a resonator chamber containing a gain medium, the gain medium comprising molecules capable of excitation to one or more excited singlet states and undergoing inter-system crossing to a triplet state with two or more sub-levels; and an apparatus for re-pumping excitons from the lower triplet sub-level to an intermediate energy state and subsequently to one of the excited singlet states; wherein re-pumping mechanism includes: a secondary electromagnetic mode that operates at a frequency resonant with the transition from the lower triplet sub-level to the intermediate energy state; a magnetic field generator apparatus for aligning and adjusting the spin states of the excitons to assure the division of the triplet sub-levels to the desired magnitude; the strength of the secondary electromagnetic field being adjustable to optimize the transition efficiency; wherein the re-pumping process involves: applying a variable magnetic field to align the spin states of the excitons, ensuring effective division and transition between triplet sub-levels; utilizing an electric field applied to a stacked monolayer sheet of graphene to generate magnetism and control the direction of magnetization, enhancing the precision of the energy state transitions; periodically reversing the polarity of the magnetic field through a commutator switch or double pole double throw (DPDT) switch to reset the population inversion by elevating lower-level excitons to higher energy states, thus maintaining the masing action without interruption; further comprising:
an apparatus to absorb ambient or pumped electromagnetic radiation and deliver it to the gain medium at an intensity sufficient to maintain the desired excitation states for continuous operation.

16. A maser comprising: a pump; a resonator chamber containing a gain medium, the gain medium comprising molecules capable of excitation to one or more excited singlet states and capable of undergoing inter-system crossing to a triplet state with three sub-levels; an apparatus for re-pumping excitons from the lower triplet sub-level directly back to the first excited singlet state, with re-pumping process facilitated by a secondary electromagnetic mode resonant with the transition from the lower triplet sub-level to the first excited singlet state, and the strength of the secondary electromagnetic field being adjustable to optimize the transition efficiency; further comprising an apparatus to absorb ambient or pumped electromagnetic radiation and deliver it to the gain medium at an intensity sufficient to maintain the desired excitation states for continuous operation.

* * * * *